United States Patent
Isler

(10) Patent No.: US 9,964,606 B2
(45) Date of Patent: May 8, 2018

(54) SENSOR MODULE AND METHOD OF MANUFACTURE

(71) Applicant: NXP B.V., Eindhoven (NL)

(72) Inventor: Mark Isler, Hamburg (DE)

(73) Assignee: NXP B.V., Eindhoven (NL)

( * ) Notice: Subject to any disclaimer, the term of this patent is extended or adjusted under 35 U.S.C. 154(b) by 0 days. days.

(21) Appl. No.: 15/582,177

(22) Filed: Apr. 28, 2017

(65) Prior Publication Data

US 2017/0328964 A1   Nov. 16, 2017

(30) Foreign Application Priority Data

May 12, 2016   (EP) ..................... 16169312

(51) Int. Cl.
| | |
|---|---|
| H01L 27/22 | (2006.01) |
| G01R 33/09 | (2006.01) |
| H01L 43/14 | (2006.01) |
| H01L 43/04 | (2006.01) |
| H01L 43/06 | (2006.01) |
| H01L 43/00 | (2006.01) |
| G01R 33/00 | (2006.01) |
| H01L 43/02 | (2006.01) |
| H01L 43/08 | (2006.01) |
| H01L 43/12 | (2006.01) |

(52) U.S. Cl.
CPC ....... *G01R 33/093* (2013.01); *G01R 33/0052* (2013.01); *G01R 33/09* (2013.01); *G01R 33/098* (2013.01); *H01L 27/22* (2013.01); *H01L 43/00* (2013.01); *H01L 43/02* (2013.01); *H01L 43/04* (2013.01); *H01L 43/06* (2013.01); *H01L 43/065* (2013.01); *H01L 43/08* (2013.01); *H01L 43/14* (2013.01); *H01L 43/12* (2013.01)

(58) Field of Classification Search
None
See application file for complete search history.

(56) References Cited

U.S. PATENT DOCUMENTS

| | | | |
|---|---|---|---|
| 6,048,739 A | 4/2000 | Hurst et al. | |
| 6,204,070 B1 * | 3/2001 | Kim .................. | H01L 27/11502 257/E21.274 |
| 9,203,016 B2 * | 12/2015 | Isler ....................... | H01L 43/02 |
| 2004/0000415 A1 * | 1/2004 | Rizzo .................. | H01L 21/6835 174/391 |
| 2014/0367815 A1 | 12/2014 | Isler et al. | |
| 2015/0200186 A1 | 7/2015 | Park | |

* cited by examiner

*Primary Examiner* — Minh-Loan Tran
(74) *Attorney, Agent, or Firm* — Charlene R. Jacobsen

(57) ABSTRACT

According to embodiments there is provided a magneto-resistive sensor module. The sensor module may comprise: an integrated circuit; magneto-resistive sensor elements arranged as a bridge circuit monolithically integrated on the integrated circuit; and a stress buffer layer arranged between the integrated circuit and the magneto-resistive sensor element. There is also a provided a method of manufacturing the magneto-resistive sensor module.

13 Claims, 2 Drawing Sheets

SENSOR MODULE AND METHOD OF MANUFACTURE

CROSS-REFERENCE TO RELATED APPLICATIONS

This application claims the priority under 35 U.S.C. § 119 of European patent application no. 16169312.2, filed May 12, 2016 the contents of which are incorporated by reference herein.

FIELD

The present disclosure relates to magneto-resistive sensor modules and to methods of manufacturing magneto-resistive sensor modules. In particular the present disclosure relates to magneto-resistive sensor modules monolithically integrated on integrated circuits and to methods of manufacturing such magneto-resistive sensor modules.

BACKGROUND

Magneto-resistive sensors are used in the automotive industry for applications such as parking sensors, angular sensors (for example in throttle valves), ABS (antilock braking systems) sensors and tire pressure sensors. Magneto-resistive sensors unlike for example, optical sensors are highly insensitive to environmental conditions such as dirt and moisture. Furthermore, magneto-resistive sensors may be integrated with an integrated circuit (ICs) to form a sensor module. However, due to the safety critical nature of these sensors they should provide precise measurements over a wide range of operating temperatures encountered in for example, automotive applications.

SUMMARY

According to embodiments there is provided a magneto-resistive sensor module comprising: an integrated circuit; magneto-resistive sensor elements arranged as a bridge circuit monolithically integrated on the integrated circuit; and a stress buffer layer arranged between the integrated circuit and the magneto-resistive sensor element.

The magneto-resistive sensor module may further comprising a dielectric layer arranged on an upper major surface of the integrated circuit, and wherein the stress buffer layer is arranged on the dielectric layer.

The integrated circuit may comprise contact elements for electrically contacting the magneto-resistive sensor to the integrated circuit.

The stress buffer layer may be arranged as discrete layers arranged beneath the magneto-resistive sensor elements only.

The stress buffer layer may have a coefficient of thermal expansion between that of the dielectric layer and that of the magneto-resistive sensor element and the stress buffer layer is arranged to absorb temperature dependent stress induced in the magneto-resistive sensor element. The stress buffer layer is has a coefficient of thermal expansion in the range $0.5 \times 10^{-6}$ 1/° C. to $23 \times 10^{-6}$ 1/° C.

The dielectric layer may be an oxide layer and the contact element and a magneto-resistive sensor elements may be metal layers.

The stress buffer layer may have a sheet resistivity greater than 100 Ohm/sq. The stress buffer layer may be a nitride compound. The stress buffer layer may be a silicon nitride layer. The stress buffer layer may be an AlN, WTiN, TiN or TaN layer.

The bridge circuit may be a full-bridge or a half bridge circuit.

Monolithic integration may reduce packaging costs, reduce manufacturing costs reduce device size and improve reliability and measurement accuracy. Inclusion of a stress buffer layer may improve the temperature dependent offset voltage Tc of the sensor.

According to embodiments there is also provided a method of manufacturing a magneto-resistive sensor module, comprising: providing an integrated circuit; monolithically integrating magneto-resistive sensor elements as a bridge circuit on the integrated circuit; and forming a stress buffer layer between the integrated circuit and the magneto-resistive sensor element.

DESCRIPTION OF THE DRAWINGS

The embodiments of the invention are described further hereinafter by way of example only with reference to the accompanying drawings in which.

In the figures and the following description like reference numerals refer to like features. The figures are schematic and not to scale.

DETAILED DESCRIPTION

Magneto-resistive sensors may be monolithically integrated on ICs as bridge circuits (either full bridge or half bridge) to form magneto-resistive sensor modules. The magneto-resistive sensors may be electrically connected to the so-called top metal layer of the ICs with an isolating intermetal dielectric layer arranged between the magneto-resistive sensors and the top metal layer. The isolating intermetal dielectric layer is typically formed by deposition at an ambient temperature of approximately 400° C. and at that temperature thermally induced stress by the isolating intermetal dielectric layer is zero by definition. However, following deposition of the isolating intermetal dielectric thermal stress will increase as the ambient temperature is reduced because the coefficients of thermal expansion of the materials used may be different. The intermetal dielectric layer will typically have a coefficient of thermal expansion which is lower than that of the magneto-resistive sensor material and the top metal layer of the IC. These differences in coefficients of thermal expansion may induce a stress in the magneto-resistive sensors monolithically integrated on ICs over the operational temperature range of the sensor. For example, a typical magneto-resistive sensor module may be rated to operate over a temperature range of −40° C. to 200°

C. Since the resistance of the magneto-resistive sensor material is strongly dependent on stress, a stress-induced contribution to the resistance of the magneto-resistive sensor material may vary with temperature. The stress on the magneto-resistive sensor structures may also be affected by the pattern of the top metal layer of the IC below, which may result in an inhomogeneous stress distribution within the intermetal dielectric layer. Therefore, because the typical arrangement of magneto-resistive sensors as bridge circuits is itself symmetrical, but is not symmetrical with respect to the underlying layers for monolithically integrated sensors, the stress effects from the underlying layers on the magneto-resistive sensors will not be the same, and thus there may be no cancelling effect in the bridge circuit. The stresses induced across the temperature range are thus asymmetrical which may result in a temperature dependent offset voltage, so-called Tc offset, which impairs the performance of the sensor module. For high precision sensors the temperature dependent offset voltage Tc offset should be as close to zero as possible.

For magneto-resistive sensors monolithically integrated with integrated circuits the temperature dependent offset voltage, Tc offset, may strongly limit or reduce the cost and size advantages gained by monolithic integration with an IC.

Figure 1:
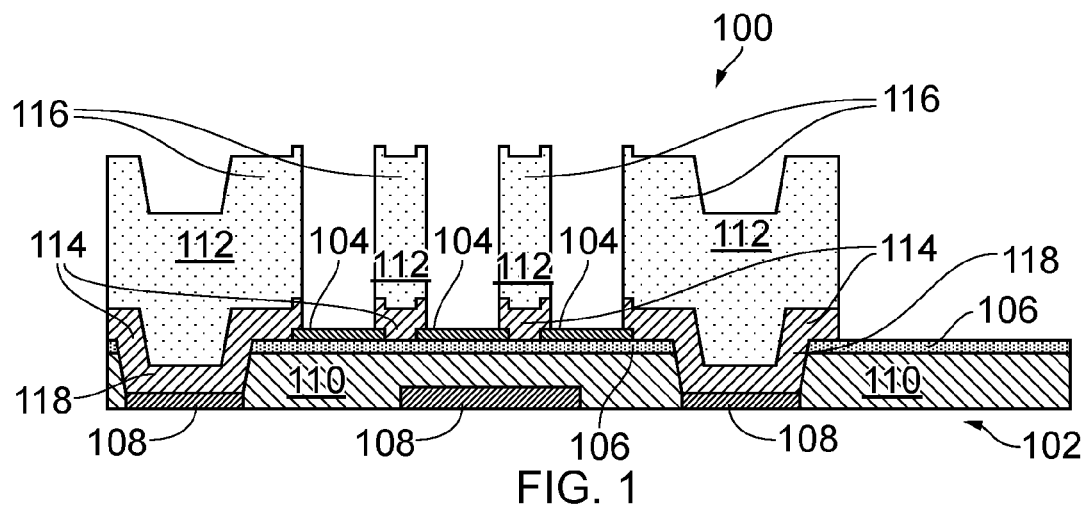
FIG. 1 illustrates a cross-sectional view of a layer structure of a magneto-resistive sensor module according to an embodiment.

In overview, the embodiment of FIG. 1, illustrates a magneto-resistive sensor module 100. The magneto-resistive sensor module 100 may be made up of an integrated circuit 102 and magneto-resistive sensor elements 104. A stress buffer layer 106 may be arranged between the integrated circuit 102 and the magneto-resistive sensor elements 104.

The integrated circuit 102 may comprise a semiconductor chip (not illustrated) formed on a substrate (not illustrated). The substrate may be a silicon substrate or any other suitable substrate material. The integrated circuit 102 may be an ASIC (application specific integrated circuit) for processing signals received from the magneto-resistive sensor elements 104 in accordance with the desired functionality of the magneto-resistive sensor module 100. The integrated circuit 102 may comprise contact elements 108 for electrically contacting the magneto-resistive sensor elements 104 to the semiconductor chip. The contact elements 108 may form part of an upper metallisation layer of the semiconductor chip and may be formed as bond pads and/or metal tracks for making appropriate electrical connection from the magneto-resistive sensor elements 104 to the semiconductor chip of the integrated circuit 102. An intermetal dielectric layer 110, for protecting the underlying structure of the integrated circuit 102 may be formed at an upper major surface of the integrated circuit 102 over the semiconductor chip.

The stress buffer layer 106 may arranged on the dielectric layer 110 of the integrated circuit 102. The stress buffer layer 106 may cover the entire surface of the dielectric layer 110.

The magneto-resistive sensor elements 104 may be arranged on the stress buffer layer 106. The magneto-resistive sensor elements 104, which may be anisotropic magneto-resistive (AMR), tunnel magneto-resistive (TMR) or giant magneto-resistive (GMR) sensors, may be arranged as so-called stripes. The magneto-resistive sensor elements 104 may be arranged as Wheatstone bridge circuit (for example a full-bridge or half bridge circuit) where each individual magneto-resistive sensor element 104 represents an individual resistive element of the full- or half-bridge Wheatstone bridge circuit. Each magneto-resistive sensor element 104 forming the bridge circuit may be formed of one or multiple elements connected in series to achieve the necessary resistance value. In the case of multiple elements connected in series they may achieve a resistive balance as required by Wheatstone bridge circuit.

Each node of the full- or half-bridge circuit may be conductively connected by way of appropriate electrical connections 112 between respective magneto-resistive sensor elements 104. The electrical connections may be made by way of, for example, wire bond connections or appropriate metallisation layers. Furthermore, the full- or half-bridge circuit may be conductively connected to the contact elements 108 for electrical connection of the magneto-resistive sensor elements 104 to the integrated circuit 102. As required, and in order to conductively connect the magneto-resistive sensor elements 104 forming the full- or half-bridge circuit to contact elements 108, appropriate recesses 118 or windows may be provided in portions of dielectric layer 110 and stress buffer layer 106 over the contact elements 108 to allow for connections by way of wire bonds or appropriate additional metallisation layers.

As mentioned, the electrical connections 112 may be wire bonds, such as for example Au wire bonds (not illustrated). Alternatively, the electrical connections 112 may be formed as metallisation stacks. The metallisation stacks may comprise a metallic diffusion barrier layer 114 formed on the contact elements 108 and magneto-resistive sensor elements 104. The metallic diffusion barrier layer 114 may act to prevent inter-metallic diffusion into the magneto-resistive sensor elements 104 which may lower the magneto resistive effect of the magneto-resistive sensor elements 104. A metallic contacting material 116 may then be formed on the metallic diffusion barrier layer 114.

Figure 2A:
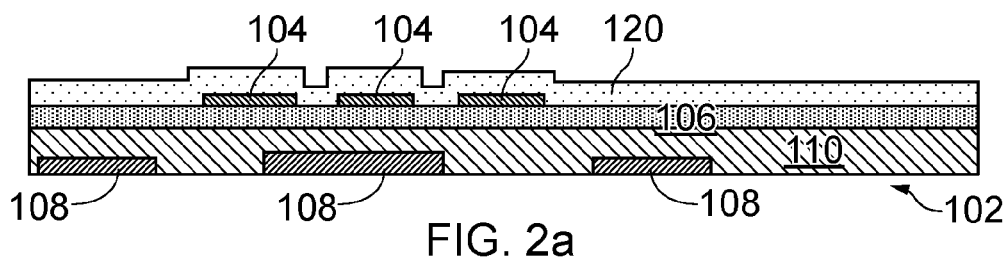
FIG. 2a illustrates processing steps for manufacture of the magneto-resistive sensor module according to an embodiment.
Figure 2B:
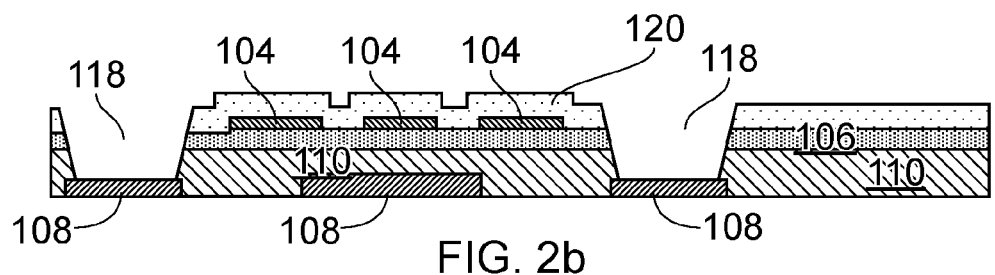
FIG. 2b illustrates processing steps for manufacture of the magneto-resistive sensor module according to an embodiment.
Figure 2C:
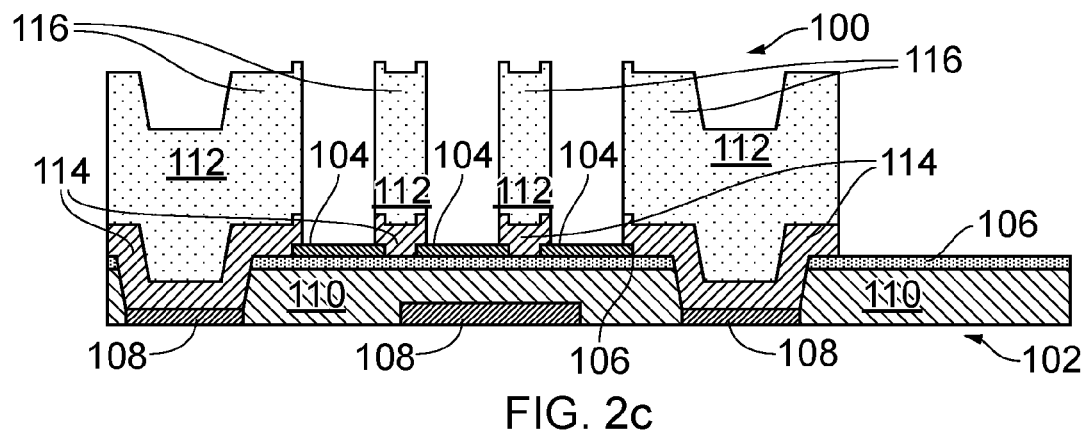
FIG. 2c illustrates processing steps for manufacture of the magneto-resistive sensor module according to an embodiment.

FIGS. 2a to 2c, illustrate the processing steps for a method of manufacturing a magneto-resistive sensor module 100 according to an embodiment. The starting point for processing, as illustrated in FIG. 2a, is the integrated circuit 102 comprising the semiconductor chip (not illustrated). The integrated circuit 102 may be formed by any appropriate means as understood by those skilled in the art of integrated circuit fabrication. The integrated circuit 102 comprises contact elements 108 which may form part of the so-called top metal layer of the integrated circuit 102. The intermetal dielectric layer 110, may be formed, by any appropriate means, for example deposition and planarization on an upper major surface of the integrated circuit 102 and over the contact elements The stress buffer layer 106 may then formed on the dielectric layer 110. The magneto-resistive sensor elements 104 may then be formed on the stress buffer layer 106. The stress buffer layer 106 may be formed by any appropriate process dependent on material used. For example, if the stress buffer layer 106 is a SiN layer it may be formed by plasma-enhanced chemical vapour deposition (PECVD). Where the stress buffer layer is a high ohmic metal such as AlN it may be formed by a physical vapour deposition (PVD) process such as sputtering.

The magneto-resistive sensor elements 104 may be formed by any appropriate method as understood by the skilled person. For example, they may be formed by deposition of a layer of permalloy over the stress buffer layer 106. Alternatively the magneto-resistive sensor elements may be formed by other magnetic materials or stacks of magnetic materials including metallic and tunnel barrier layers as needed for GMR and TMR sensors, respectively, A layer of photoresist material (not illustrated) may then be deposited on the magnetic layer to define the geometry of the magneto-resistive sensor elements 104 followed by a wet or dry etch to pattern the magnetic layer to the desired final structure. The remaining photoresist material may be removed by any appropriate means. Alternatively the magneto-resistive sensor elements 104 may be patterned onto the stress buffer layer 106. The magnetic layer forming the magneto-resistive sensor elements 104 may be any appropriate material such as for example NiFe or permalloy.

Following formation of the magneto-resistive sensor elements 104 a protection layer 120 may be formed over the magneto-resistive sensor elements 104 to protect them during subsequent processing steps.

Windows or through holes 118 to allow for formation of the electrical connections to the contact elements 108 may then formed as shown in FIG. 2b. The windows may be formed by any appropriate means, such as for example deposition of a photoresist to define the geometry of the windows 118. This may then followed by a wet or dry etch to remove the protection layer 120, the stress buffer layer 106, and the dielectric layer 110 in a desired area over the contact elements 108.

With reference to FIG. 2c, in the step of forming the electrical connections 112 as metallisation stacks, the metallic diffusion barrier layer 114 is deposited on the contact element 108, followed by deposition of the metallic contacting material 116 on the metallic diffusion barrier layer 114. Deposition of the metallic diffusion barrier layer 114 may also be carried out at, and between, the magneto-resistive sensor elements 104 to form the connections between respective magneto-resistive sensor elements 104 to form full bridge or half bridge circuit as discussed above. The formation of the metallisation stacks may be by any appropriate means such as for example, deposition of the metallic diffusion barrier layer 114 followed by deposition metallic contacting material 116. A photoresist is then deposited on the metallic contacting material 116 to define the geometry of the electrical connections 112.

This may then followed by a wet or dry etch to form the metallisation stacks. The metallic diffusion barrier layer 114 and the metallic contacting material 116 may be deposited by sputtering or any other appropriate technique.

Where the electrical connections 112 are Au wire bonds (not illustrated), an appropriate wire bonding machine may be used to form the connections as understood by those skilled in the art.

Figure 3:
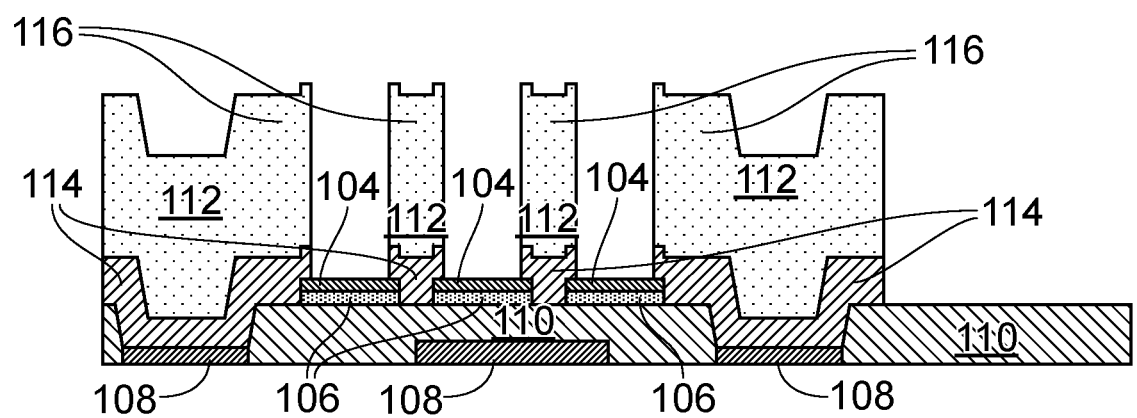
FIG. 3 illustrates a cross-sectional view of a layer structure of magneto-resistive sensor module according to a further embodiment.

FIG. 3, illustrates a further embodiment of the magneto-resistive sensor module 100, in which the stress buffer layer 106 is only located beneath the magneto-resistive sensor elements 104 and does not cover the entire surface of the dielectric layer 110 as described above. The embodiment of FIG. 3 may be formed by a similar method (as described above with reference to FIGS. 2a to 2c) to that of FIG. 1. In the case of forming the stress buffer layer 106 it may deposited by any appropriate means on the dielectric layer 110 and patterned, for example, with the same mask as the magneto-resistive sensor elements after patterning of the magneto-resistive sensor elements.

In each of the above described embodiments a further dielectric layer (not illustrated) may be arranged over the magneto-resistive sensor module 100 to provide appropriate protection from environmental conditions.

As mentioned the integrated circuit 102 may be any appropriate circuit such as an ASIC which can provide functionality such as amplification of magneto-resistive signals from the magneto-resistive sensor elements 104, signal conditioning, and offset cancellation, such as cancellation of the temperature dependent offset voltage Tc. The contact elements 108, for electrically contacting the magneto-resistive sensor elements 104 to the semiconductor chip of the integrated circuit 102 may be Cu based and/or Al based metallisation layers for example, AlCu metal. The intermetal dielectric layer (IMD) 110 may be formed of any appropriate material such as silicon oxide. The magneto-resistive sensor elements 104 may be any appropriate magnetic material such as NiFe or Permalloy, respectively for anisotropic magneto-resistive applications. In this case, the ratio of Ni to Fe may be 80:20.

For giant magneto-resistive (GMR) or tunnel magneto-resistive (TMR) sensors stacks the magneto-resistive sensor elements 104 typically consist of at least two magnetic layers which have typically a composition of Ni, Fe or Co and are separated by a non-magnetic layer. Typically one of the two magnetic layers is soft-magnetic and acts as a so-called free layer whose magnetisation easily responses to external magnetic fields. The other magnetic layer is typically coupled to an antiferromagnetic layer and behaves as hard magnetic layer providing a reference magnetisation. For GMR stacks the non-magnetic layer between the two magnetic layers may be a metallic layer, such as Cu, whereas for TMR stacks this layer is non-metallic and isolating, such as $Al_2O_3$ or MgO acting as a tunnel barrier.

The stress buffer layer 106 may consist of a high ohmic material, that is, have a high sheet resistivity, typically greater than 100 Ohm/sq. In this regard the stress buffer layer 106 may be SiN. Alternatives may include nitride based layers such as AlN or WTiN, or Ti(O)N. The choice of a high sheet resistivity material for the stress buffer layer 106 may prevent unwanted parallel conduction which can reduce the magneto-resistive effect of the magneto-resistive sensor elements 104. In addition the stress buffer layer 106 may have a coefficient of thermal expansion between the coefficient of thermal expansion for the dielectric layer 110 and that of both the contact elements 108 and the magneto-resistive sensor elements 104. For example, in the case where the stress reduction 106 layer is SiN, the dielectric layer 110 is SiO, the contact elements 108 are AlCu, and the magneto-resistive sensor elements 104 are NiFe, the coefficients of thermal expansion may be:

SiO—$0.5 \times 10^{-6}$ 1/° C. (dielectric layer 110)
SiN—$2.8 \times 10^{-6}$ 1/° C. (stress buffer 106 layer)
NiFe—$12 \times 10^{-6}$ 1/° C. (magneto-resistive sensor elements 104)
AlCu—$23 \times 10^{-6}$ 1/° C. (contact elements 108)

Typically the stress buffer layer will have a thickness of less than 200 nm and contain nitrogen thereby providing a diffusion barrier and have a coefficient of thermal expansion in the range $0.5 \times 10^{-6}$ 1/° C. to $23 \times 10^{-6}$ 1/° C.

Magneto-resistive sensor modules 100 according to embodiments may be designed to operate over a temperature range of −40° C. to 200° C. Operation over this temperature range may result in thermally induced stresses in the magneto-resistive sensor elements 104 due to different coefficients of thermal expansion of the magneto-resistive sensor elements 104, the dielectric layer 110 and the contact elements 108. In particular the metals of the magneto-resistive sensor elements 104 and contact elements 108 may have greatly different expansion coefficients to that of the dielectric layer 110. The different coefficients of thermal expansion of the dielectric layer 110 and the contact elements 108 may generate a non-homogeneous stress distribution within the dielectric layer which is dependent on the pattern of the top metal layer of the integrated circuit. The stress buffer layer 106, which may also be termed a stress reduction layer, may absorb some of the stresses induced in the magneto-resistive sensor elements 104. As mentioned above, the resistance of the material magneto-resistive sensor element is strongly dependent on thermally induced stress, and induced stress may result in a temperature dependent offset voltage Tc which impairs the performance of the sensor module. By absorbing or buffering thermally induced stressed in the stress buffer layer 106 the temperature dependent offset voltage Tc may be reduced. This may result in more precise measurements over a wider range of temperatures, in particular over the wide range of temperatures encountered in automotive sensor applications.

Particular and preferred aspects of the invention are set out in the accompanying independent claims. Combinations of features from the dependent and/or independent claims may be combined as appropriate and not merely as set out in the claims.

The scope of the present disclosure includes any novel feature or combination of features disclosed therein either explicitly or implicitly or any generalisation thereof irrespective of whether or not it relates to the claimed invention or mitigate against any or all of the problems addressed by the present invention. The applicant hereby gives notice that new claims may be formulated to such features during prosecution of this application or of any such further application derived there from. In particular, with reference to the appended claims, features from dependent claims may be combined with those of the independent claims and features from respective independent claims may be combined in any appropriate manner and not merely in specific combinations enumerated in the claims.

Features which are described in the context of separate embodiments may also be provided in combination in a single embodiment. Conversely, various features which are, for brevity, described in the context of a single embodiment, may also be provided separately or in any suitable sub combination.

Term "comprising" does not exclude other elements or steps, the term "a" or "an" does not exclude a plurality. Reference signs in the claims shall not be construed as limiting the scope of the claims.

The invention claimed is:

1. A magneto-resistive sensor module comprising:
   an integrated circuit;
   magneto-resistive sensor elements arranged as a bridge circuit monolithically integrated on the integrated circuit; and
   a stress buffer layer arranged between the integrated circuit and the magneto-resistive sensor element, wherein the stress buffer layer is arranged as discrete layers arranged beneath the magneto resistive sensor elements only.

2. The magneto-resistive sensor module of claim 1, further comprising a dielectric layer arranged on an upper major surface of the integrated circuit, and wherein the stress buffer layer is arranged on the dielectric layer.

3. The magneto-resistive sensor module of claim 2, wherein the dielectric layer is an oxide layer and the contact element and a magneto-resistive sensor element are metal layers.

4. The magneto-resistive sensor module of claim 1, wherein the integrated circuit comprises contact elements for electrically contacting the magneto-resistive sensor to the integrated circuit.

5. The magneto-resistive sensor module of claim 1, wherein the stress buffer layer has a sheet resistivity greater than 100 Ohm/sq.

6. The magneto-resistive sensor module of claim 1, wherein the stress buffer layer is a nitride compound.

7. The magneto-resistive sensor module of claim 1, wherein the stress buffer layer is a silicon nitride layer.

8. The magneto resistive sensor module of claim 1 wherein the bridge circuit is a full-bridge or a half bridge circuit.

9. A magneto-resistive sensor module comprising:
   an integrated circuit;
   magneto-resistive sensor elements arranged as a bridge circuit monolithically integrated on the integrated circuit;
   a dielectric layer arranged on an upper major surface of the integrated circuit; and
   a stress buffer layer arranged between the integrated circuit and the magneto-resistive sensor element, wherein the stress buffer layer is arranged on the dielectric layer, and wherein the stress buffer layer has a coefficient of thermal expansion between that of the dielectric layer and that of the magneto-resistive sensor element and the stress buffer layer is arranged to absorb temperature dependent stress induced in the magneto-resistive sensor element.

10. A magneto-resistive sensor module comprising:
    an integrated circuit;
    magneto-resistive sensor elements arranged as a bridge circuit monolithically integrated on the integrated circuit; and
    a stress buffer layer arranged between the integrated circuit and the magneto-resistive sensor element, wherein the stress buffer layer has a coefficient of thermal expansion in the range $0.5 \times 10^{-6}$ 1/° C. to $23 \times 10^{-6}$ 1/° C.

11. A magneto-resistive sensor module comprising:
    an integrated circuit;
    magneto-resistive sensor elements arranged as a bridge circuit monolithically integrated on the integrated circuit; and
    a stress buffer layer arranged between the integrated circuit and the magneto-resistive sensor element, wherein the stress buffer layer is AlN, WTiN, TiN or TaN layer.

12. A method of manufacturing a magneto-resistive sensor module, comprising:
    providing an integrated circuit;
    monolithically integrating magneto-resistive sensor elements as a bridge circuit on the integrated circuit; and
    forming a stress buffer layer between the integrated circuit and the magneto-resistive sensor element, wherein the stress buffer layer is formed as discrete layers arranged beneath magneto-resistive sensor elements only.

13. The method of claim 12, further comprising:
    forming the stress buffer layer on a dielectric layer, wherein the dielectric layer is arranged on an upper major surface of the integrated circuit.

* * * * *